US012463003B2

(12) United States Patent
Satoh et al.

(10) Patent No.: US 12,463,003 B2
(45) Date of Patent: Nov. 4, 2025

(54) HIGH TEMPERATURE ION SOURCE

(71) Applicant: Axcelis Technologies, Inc., Beverly, MA (US)

(72) Inventors: Shu Satoh, Byfield, MA (US); Neil Colvin, Merrimack, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 19/039,069

(22) Filed: Jan. 28, 2025

(65) Prior Publication Data

US 2025/0246396 A1 Jul. 31, 2025

Related U.S. Application Data

(60) Provisional application No. 63/627,292, filed on Jan. 31, 2024.

(51) Int. Cl.

*H01J 37/09* (2006.01)
*H01J 37/08* (2006.01)
*H01J 37/34* (2006.01)

(52) U.S. Cl.

CPC .............. *H01J 37/09* (2013.01); *H01J 37/08* (2013.01); *H01J 37/3447* (2013.01)

(58) Field of Classification Search

CPC ......... H01J 37/09; H01J 37/08; H01J 37/3447
See application file for complete search history.

(56) References Cited

U.S. PATENT DOCUMENTS 11,961,696 B1 * 4/2024 Jerez ....................... H01J 37/08

* cited by examiner

*Primary Examiner* — Wyatt A Stoffa
*Assistant Examiner* — Hanway Chang
(74) *Attorney, Agent, or Firm* — Eschweiler & Potashnik, LLC

(57) ABSTRACT

An arc chamber for an ion source provides a source of thermal radiation positioned within an interior region of the arc chamber. One or more components generally enclose the interior region of the arc chamber, defining an arc chamber environment within the interior region of the arc chamber. A thermal radiation shield is positioned between the one or more components and an external environment outside of the arc chamber and limits a transfer of the thermal radiation from the chamber environment to the external environment. The one or more components can be an extraction aperture plate having an extraction aperture defined therethrough. The thermal radiation shield is positioned proximate to, and covers at least approximately 75% of the exterior surface of the extraction aperture plate to primarily prevent thermal radiation for passing through the extraction aperture plate.

16 Claims, 8 Drawing Sheets

HIGH TEMPERATURE ION SOURCE

REFERENCE TO RELATED APPLICATIONS

This application claims the benefit of U.S. Provisional Application Ser. No. 63/627,292 filed Jan. 31, 2024, entitled, “HIGH TEMPERATURE ION SOURCE”, the contents of which are herein incorporated by reference in their entirety.

TECHNICAL FIELD

The present invention relates generally to ion implantation systems, and more particularly to a thermal radiation shield for a region of an arc chamber of an ion source.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an “n-type” extrinsic material wafer, whereas a “p-type” extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources in ion implanters typically generate the ion beam by ionizing a source material in an arc chamber, wherein a component of the source material is a desired dopant element. The desired dopant element is then extracted from the ionized source material in the form of the ion beam. In some instances, after the running process recipes involving phosphorus, the phosphorus is known to accumulate or be “stored” or “loaded” in some ion source components. The mechanism of such phosphorus storage, however, is not well understood. Some evidence suggests a formation of an alloy of phosphorus with a metal of the ion source components, such as tungsten.

Fortunately, in most conventional ion source operations, the stored phosphorus does not significantly impact the desired operation of the ion source. However, in a process recipe which utilizes a very high arc power condition of the ion source, such as As++++ (i.e., Arsenic 4+), outgassing of phosphorus from components of the ion source due to the storage of phosphorus from previous process recipes can become considerable enough to hinder normal setup and/or operation of the ion source. For example, a raised vacuum level in an arc chamber of the ion source can be caused by outgassing of stored phosphorus, which can significantly reduce the available As++++ current due to a very high cross section of electron capture reactions of an As++++ ion beam. In an example of a severe outgassing case, a gas pressure within the arc chamber can be dominated by such outgassing, and effective control of the operation of the ion source can be significantly reduced. As such, maintenance of the ion source is typically performed to replace components having such stored phosphorus.

SUMMARY

The present disclosure provides a solution associated with outgassing of ion source components by reducing the capacity to store phosphorus or other materials in ion source components. The following thus presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

Aspects of the disclosure facilitate ion implantation processes for mitigating contamination concurrent with implanting ions into a workpiece. According to one exemplary aspect, an ion implantation system is provided having an ion source configured to form an ion beam, a beamline assembly configured to selectively transport the ion beam, and an end station is configured to accept the ion beam for implantation of the ions (e.g., arsenic ions) into a workpiece.

In accordance with one exemplary aspect, an arc chamber for the ion source of the ion implantation system is provided. The arc chamber, for example, comprises a source of electrons positioned within an interior region of the arc chamber. One or more components generally enclose the interior region of the arc chamber, therein defining an arc chamber environment within the interior region of the arc chamber. Further, in accordance with one example, one or more thermal radiation shields are positioned between the one or more components and an external environment directly outside of the arc chamber. The one or more thermal radiation shields, for example, limit a transfer of the thermal radiation from the chamber environment to the external environment.

According to one example, a first of the one or more components comprises an extraction aperture plate having an extraction aperture defined therethrough. The extraction aperture, for example, is defined along an exterior surface of the extraction aperture plate, wherein the first of the one or more thermal radiation shields is positioned proximate to, and covers at least approximately 75% of the exterior surface of the extraction aperture plate. The first of the one or more thermal radiation shields, in another example, covers substantially all of the exterior surface of the extraction aperture plate. The one or more thermal radiation shields, for example, generally prevent thermal radiation for passing through the extraction aperture plate, except for a transfer of the thermal radiation through the extraction aperture.

In another example, the extraction aperture plate comprises a raised portion, and the first of the one or more thermal radiation shields comprises an opening defined therethrough. The raised portion of the extraction aperture plate, for example, is configured to extend through the opening in the first of the one or more thermal radiation shields.

One or more coupling features may be further configured for selectively coupling of at least the first of the one or more thermal radiation shields to a body of the arc chamber. In another example, the one or more thermal radiation shields comprise one or more layers of a material configured to provide a radiative barrier between the chamber environment and the external environment.

In accordance with another aspect of the disclosure, an extraction aperture assembly is provided for an arc chamber of an ion source. The extraction aperture assembly, for example, comprises an extraction aperture plate and a thermal radiation shield. The extraction aperture plate, for example, has an extraction aperture defined therethrough, wherein the extraction aperture is defined along an exterior surface of the extraction aperture plate. The thermal radiation shield, for example, is configured to selectively couple the extraction aperture plate to the arc chamber, wherein the thermal radiation shield is configured to cover at least approximately 75% of the exterior surface of the extraction aperture plate, thereby limiting a transfer of thermal radiation from arc chamber environment to an external environment.

In one example, the thermal radiation shield generally prevents thermal radiation for passing through the extraction aperture plate, except for a transfer of the thermal radiation through the extraction aperture. In another example, the thermal radiation shield covers substantially all of the exterior surface of the extraction aperture plate, except for a region proximate to the extraction aperture.

In another example, the extraction aperture plate comprises a raised portion extending from the exterior surface, and wherein the thermal radiation shield comprises an opening defined therethrough, wherein the raised portion of the extraction aperture plate is configured to extend through the opening in the thermal radiation shield.

The thermal radiation shield may further comprise one or more coupling features configured for selectively coupling at least the thermal radiation shield to a body of the arc chamber.

According to other exemplified aspects, an ion implantation system is provided, wherein the ion implantation system comprises the aforementioned arc chamber and/or extraction aperture assembly. In another exemplified aspect, a method for increasing a lifetime of an ion source is provided. The method, for example, comprises selectively heating an extraction aperture region of an arc chamber of the ion source. The heating of the extraction aperture region, for example, generally prevents an outgassing of undesirable contaminants from one or more surfaces internal to the arc chamber housing to a region external to the ion source assembly. The one or more surfaces, for example, may comprise an insulator surface associated with the ion source.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
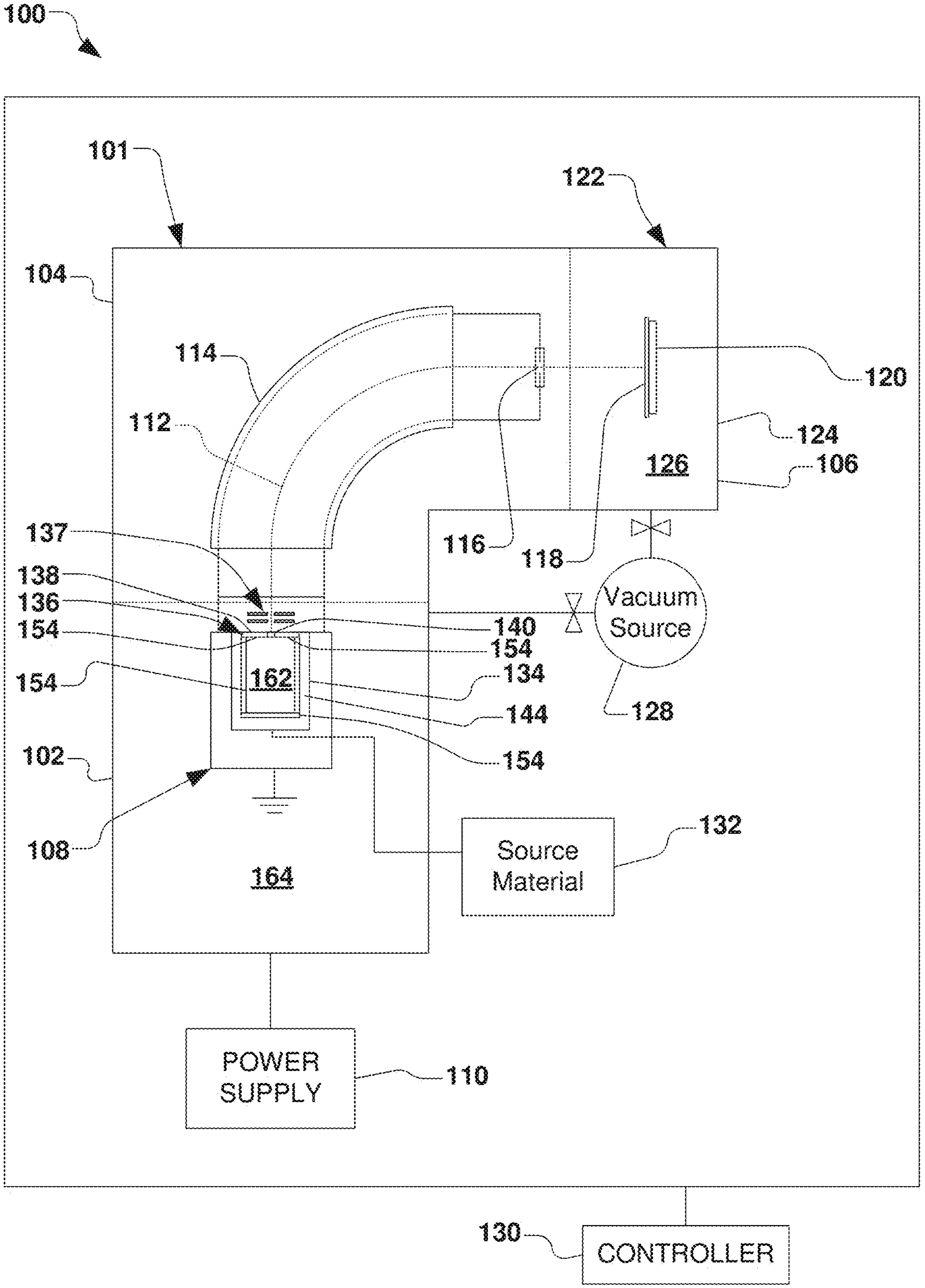
FIG. 1 is a block diagram of a vacuum system in accordance with several aspects of the present disclosure.

The present disclosure is directed generally toward a thermal radiation shield for an ion source of an ion implantation system. More particularly, the present disclosure is directed toward one or more thermal radiation shields configured for maintaining an elevated temperature of one or more components associated with the ion source in order to mitigate a deleterious storage of phosphorus in the one or more components. The present disclosure thus contemplates a solution to deleterious storage of phosphorus in the one or more components by reducing the capacity of phosphorus to be stored in the one or more components associated with the ion source.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In order to gain a better understanding of the present disclosure, FIG. 1 illustrates an exemplary semiconductor processing system 100. The semiconductor processing system 100 in the present example comprises an ion implantation system 101, however various other types of semiconductor processing systems are also contemplated, such as plasma processing systems, or other semiconductor processing systems. The ion implantation system 101, for example, comprises a terminal 102, a beamline assembly 104, and an end station 106. Generally speaking, an ion source assembly 108 in the terminal 102 is coupled to a power supply 110 to ionize a dopant material into a plurality of ions from the ion source assembly to form an ion beam 112.

The ion beam 112 in the present example is directed through a mass analysis apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure. According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber. The vacuum source 128 may comprise one or more vacuum pumps operably coupled to one of more of the terminal 102, beamline assembly 104, and end station 106 for selective evacuation, thereof. Further, a controller 130 is provided for selective control of the semiconductor processing system 100.

According to the present disclosure, an ion source material 132 is provided to an arc chamber 134 of the ion source assembly 108 for the production of ions associated with the ion beam 112. The ion source material 132, for example, may comprise various dopant species, and may be provided in gaseous or solid form to the arc chamber.

For example, an aperture assembly 136 is associated with the ion source assembly 108. One or more extraction electrodes 137 are configured to extract ions from the ion source assembly through a front plate 138 of the aperture assembly 136. The one or more extraction electrodes 137, for example, are in close proximity to the front plate 138, whereby the one or more extraction electrodes are biased to pull ions through a front aperture 140 (also called a slit) of the front plate, while also inhibiting back-streaming of neutralizing electrons that may be close to the ion source assembly 108, or back to the one or more extraction electrodes.

The present disclosure appreciates that workpieces 118 may comprise various materials, and that various species of ions may be implanted into the workpieces. Ion implantation into silicon carbide, for example, utilizes a different class of implant dopants than those used for workpieces 118 comprised of silicon. Further, various energies may be implemented in the ion implantation system for such various implants. In various process recipes for the ion implantation, for example, aluminum, phosphorus, arsenic, boron, and nitrogen implants may be performed utilizing the same ion implantation system 101.

Figure 2A:
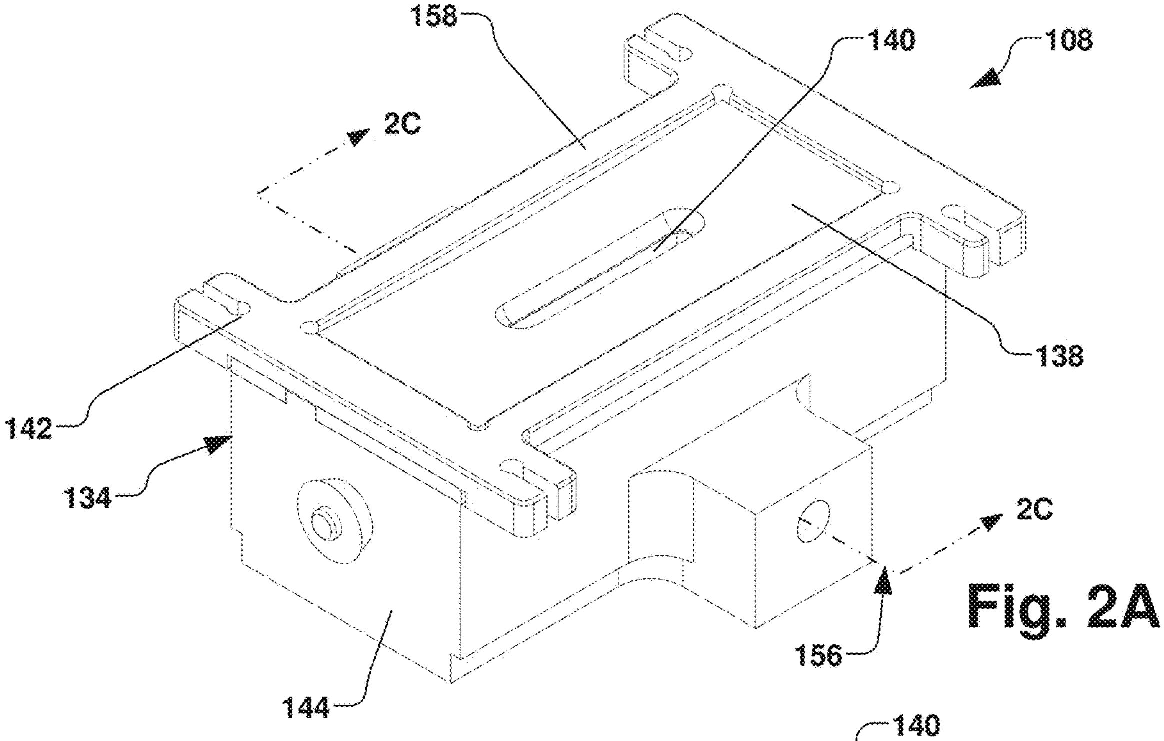
FIG. 2A illustrates a perspective exploded view of an ion source assembly in accordance with one example.
Figure 2B:
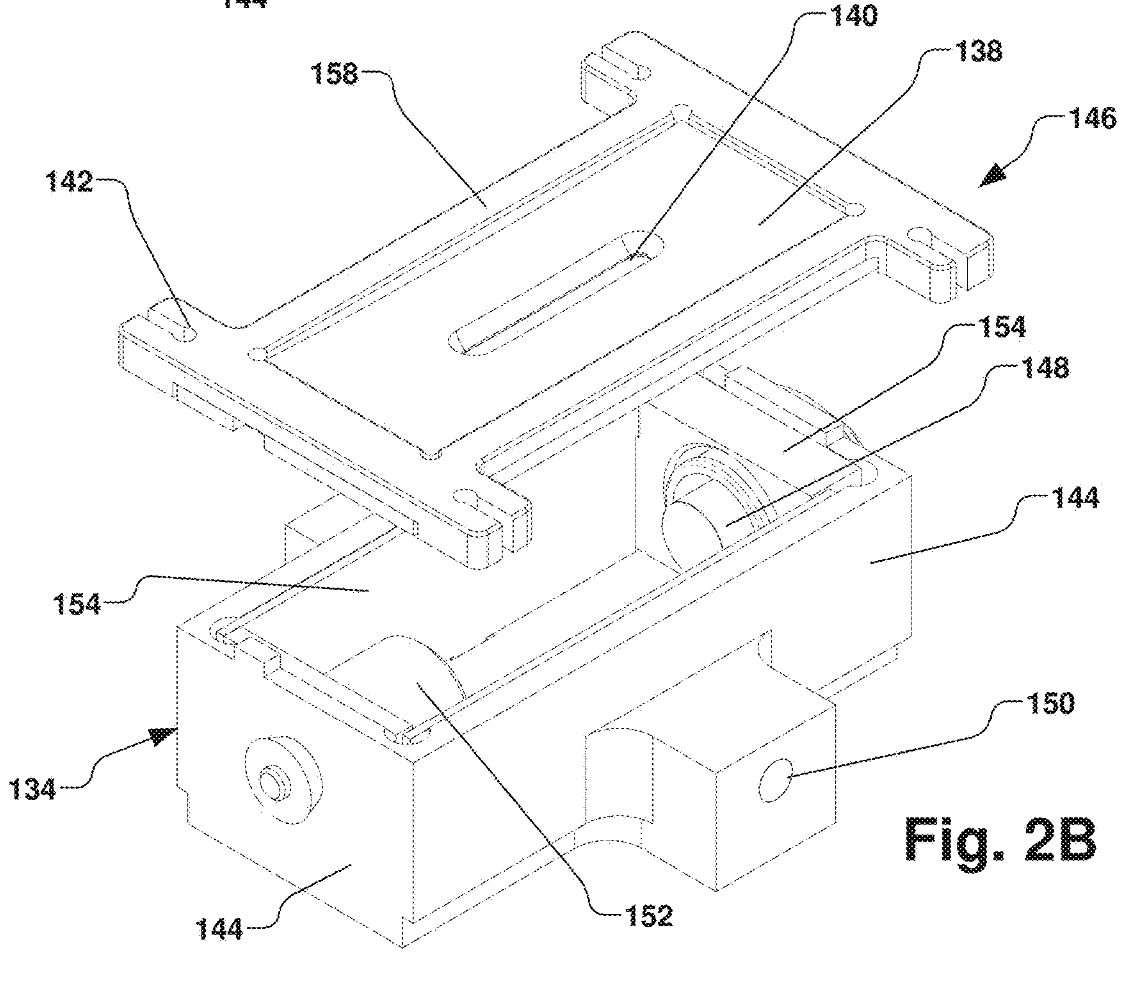
FIG. 2B illustrates an exploded perspective view of the ion source assembly of FIG. 2A.
Figure 2C:
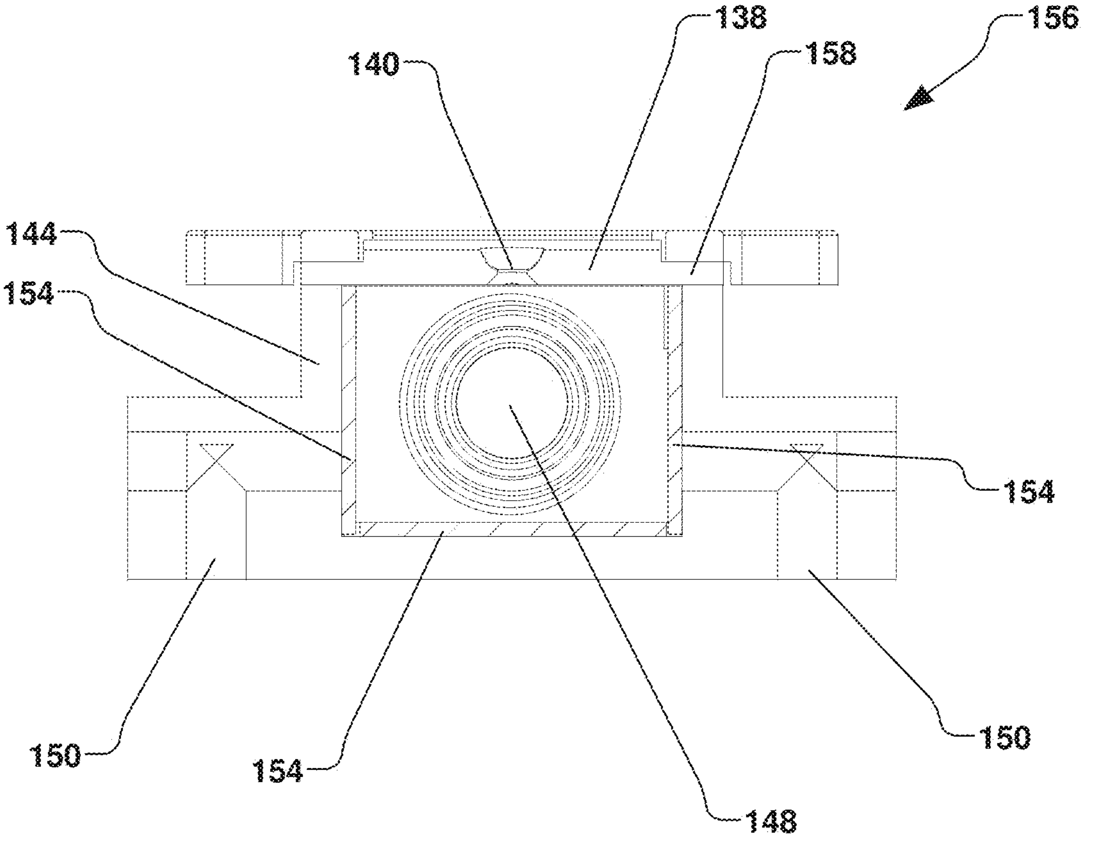
FIG. 2C illustrates a cross-sectional view of the ion source assembly of FIGS. 2A-2B.

FIGS. 2A-2B illustrate an example of an ion source assembly 108 that can be implemented in the Optima XE Ion Implantation System by Axcelis Technologies, Inc. of Beverly, MA, whereby a front plate clamp 142, for example, clamps or otherwise operably couples the front plate 138 to an arc chamber body 144 of the ion source assembly 108. FIG. 2B illustrates the front plate 138 and front plate clamp 142 in a lifted position 146 showing the inside of the arc chamber 134. The source body, 144, for example, is a block of refractory metal, such as tungsten. A cathode 148, for example, emits energetic electrons to ionize a source material (not shown) that is fed into the arc chamber 134 through one or more gas inlets 150. A repeller 152, for example, increases the mean free path length of the electrons in the arc chamber 134 to enhance the ionization. One or more liners 154, for example, line or otherwise cover the interior walls of the arc chamber body 144, and can comprise thin pieces of refractory metals, such as tungsten, as replaceable or consumable parts. A cross section 156 of the ion source assembly 108 of FIGS. 2A-2B is shown in FIG. 2C additional clarity.

As a result of the ionization, a plasma (a mixture of ions and electrons), is formed in the volume contained by the one or more liners 154 and the front plate 138. The front aperture 140 in the front plate 138, for example, allows some of the ions to be pulled outside of the arc chamber 134 to become the ion beam 112 illustrated in FIG. 1.

The present disclosure, for example, appreciates that some components of the ion source assembly 108, for example, may have a greater propensity to store or "load"

dopants such as phosphorous (P) during an operation thereof. While not fully understood, when the one or more liners 154 of the ion source assembly 108 comprise tungsten (W), for example, and the arc chamber 134 is operated at a high temperature and exposed to phosphorus (P), an alloy of the tungsten and phosphorus is believed to be formed, whereby the alloy is capable of efficiently "storing" or accumulating phosphorus within the component over time. Such a storage or accumulation of phosphorus can lead to deleterious issues, such as outgassing, when implanting using other species, currents, or temperatures while using the same components (e.g., the one or more liners 154). Outgassing, for example, has a tendency to increase a pressure within, or proximate to, the ion source assembly 108, thus potentially leading to an unstable formation of the ion beam 112.

Some experimental evidence associated with the present disclosure suggests that various ion source components of the ion source assembly 108, such as the one or more liners 154 (e.g., side and bottom liners) and the front plate 138 may exhibit varying degrees of outgassing, once exposed to a phosphorus-loading operation of the ion source assembly.

Figure 3:
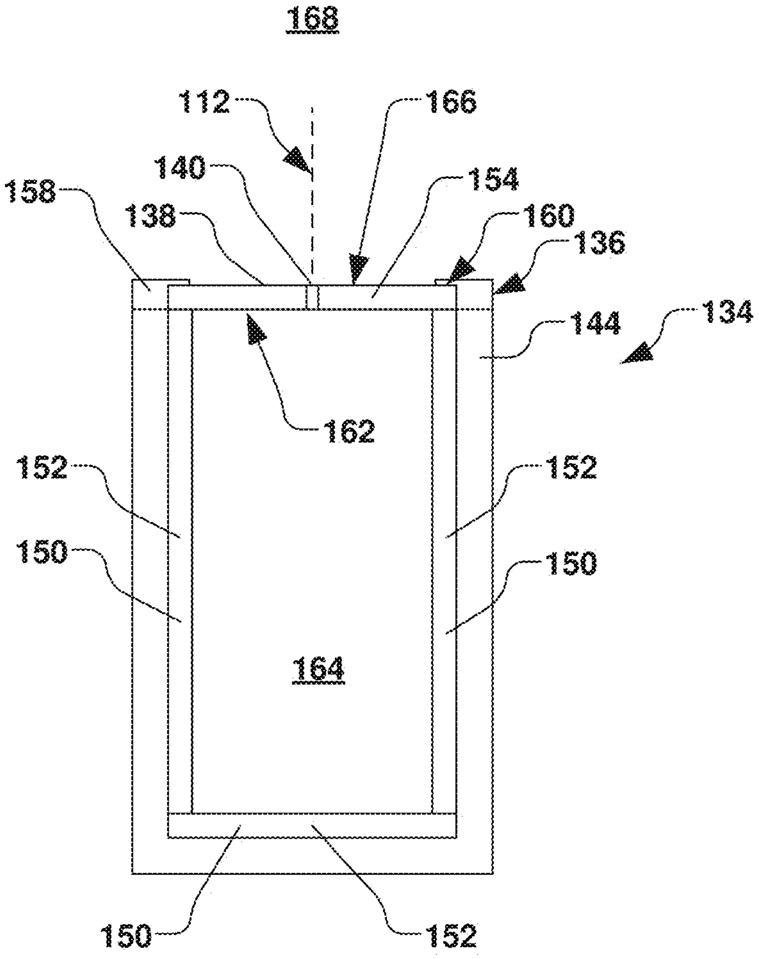
FIG. 3 illustrates a plan view of an example arc chamber.

In accordance with the example illustrated in FIGS. 2A-2C the front plate 138 (e.g., comprising the front aperture 140 or "slit" defined therein) is not, by itself, clamped or coupled to the arc chamber body 144 of the arc chamber 134. Rather, the front plate clamp 142 defines a mounting frame 158 as illustrated in FIG. 3, whereby the mounting frame is separate from the front plate 138 and secures the front plate to the arc chamber 134 about peripheral edges 160 of the front plate. As such, the front plate 138 may be replaced when worn, while the mounting frame 158 may be retained for clamping of another front plate to the arc chamber body 144 of the arc chamber 134. The mounting frame 158 in the present example only supports the peripheral edges 160 of the front plate 138, whereby an inside surface 162 of the front plate 138 is exposed to an arc chamber environment 164 (e.g., a plasma environment at an elevated temperature) within the arc chamber 134, as well as exposing an outside surface 166 to an external environment 168 (e.g., an environment at room temperature) outside of the arc chamber.

In a first experiment, the arc chamber 134 of the ion source assembly 108 of FIG. 1 was fitted with the front plate 138 and mounting frame 158 of FIG. 3 in the manner shown in FIGS. 2A-2C, and operated using a phosphorous process recipe (e.g., a phosphorous-loading operation). After a predetermined operation period, all of the liners 154, except for the front plate 138, were serviced and replaced with new components. The first experiment yielded a high amount of outgassing upon subsequent operation after the service.

In a second experiment, the ion source assembly 108 was again fitted with the liners 154 in new condition, and the ion source assembly 108 was again operated using the phosphorous process recipe. After the predetermined operation period expired in the second experiment, only the front plate 138 was serviced and replaced. The second experiment yielded a substantially lower amount of outgassing when only the front plate 138 of the arc chamber 134 was replaced during maintenance of the ion source assembly 108. The present disclosure accordingly appreciates that the front plate 138 can carry a significant potential of being a primary source of phosphorus storage in the ion source assembly 108.

The present disclosure thus appreciates that, despite the front plate 138 and various other components that are exposed to the plasma within the arc chamber 134 being comprised of similar materials (e.g., tungsten), the front plate 138 (also called a "source slit" or "arc slit") has a greater propensity to store phosphorus than the various other ion source components, such as the one or more liners 154.

For example, in a typical operation, such as in a high current arsenic 4+ ion implantation process (or other high temperature implantation such as boron, etc.), the ion source assembly 108 of FIG. 1 is operated at a substantially higher temperature than that of a phosphorous ion implantation process.

When running a phosphorous ion implantation process, for example, it is believed that phosphorous has a tendency to be stored in various components of the ion source assembly 108. As such, when the ion source assembly 108 is heated to a higher temperature in the higher temperature arsenic 4+ implantation process, for example, phosphorous that may have been stored in the components of the ion source during previous phosphorous ion implantation processing will have a tendency to be re-emitted or outgassed from the components. Such outgassing can increase a pressure within the ion source assembly 108 and/or contaminate the ion beam 112. Typically, the largest amount of stored phosphorous is emitted from the front plate 138 shown in FIGS. 2A-2C and 3, whereby the extraction aperture plate is typically the coldest portion within the ion source because its outside surface 166 faces directly to the external environment 168 which is at room temperature.

As illustrated in FIG. 3, for example, the present disclosure appreciates that the one or more liners 154 are generally enclosed by the arc chamber body 144 which acts as radiation heat shield(s), whereby radiation heat loss associated with the one or more liners to the external environment 168 is quite small. The front plate 138, on the other hand, being exposed directly to the external environment 168, is free to radiate thermal energy from the arc chamber environment 164 within the arc chamber 134 to the external environment, thus suggesting the temperature of the extraction aperture plate being lower than the temperature(s) of the one or more liners 154.

The inventors presently appreciate a solution to decreasing outgassing of phosphorus from the one or more liners 154 may be associated with a temperature of the ion source components, and specifically, the temperature of the front plate 138. The present disclosure thus contemplates that the amount of phosphorus stored in the front plate 138 can be reduced by raising the temperature of the front plate. The primary heat loss mechanism of components of the ion source assembly 108 of FIG. 1, for example, is by radiation due to the overall high vacuum environment in which the arc chamber 134 is operated (e.g., in both the arc chamber environment 164 and external environment 168).

Figure 4:
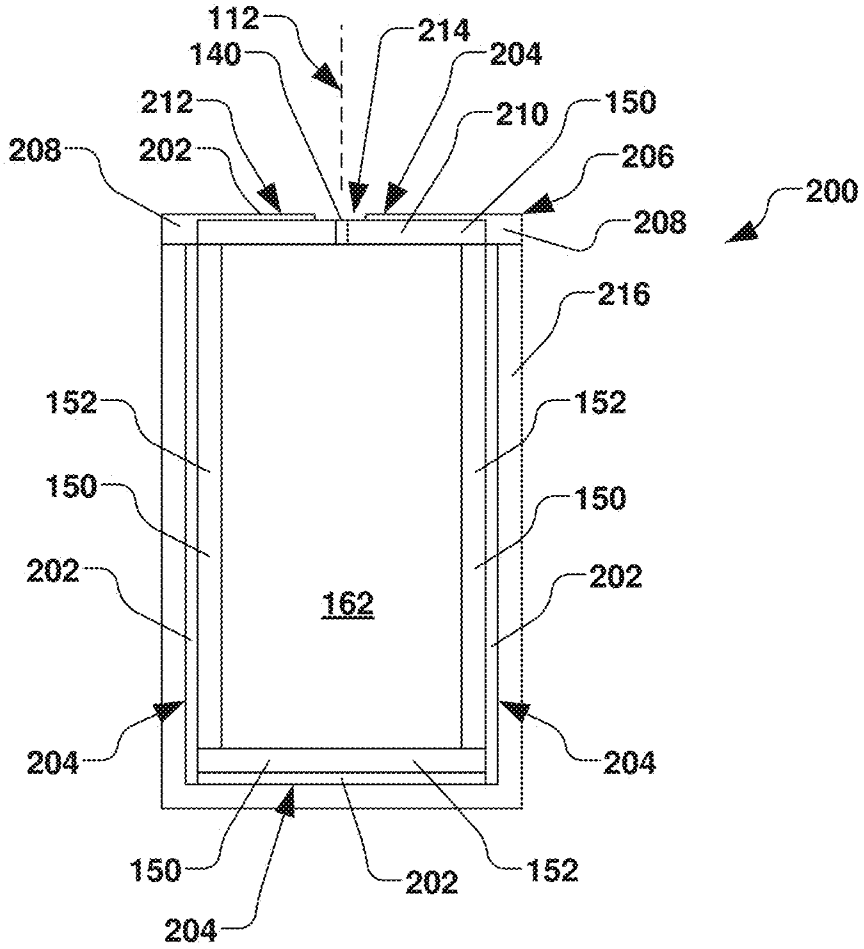
FIG. 4 illustrates a plan view of an arc chamber in accordance with various aspects of the present disclosure.
Figure 5A:
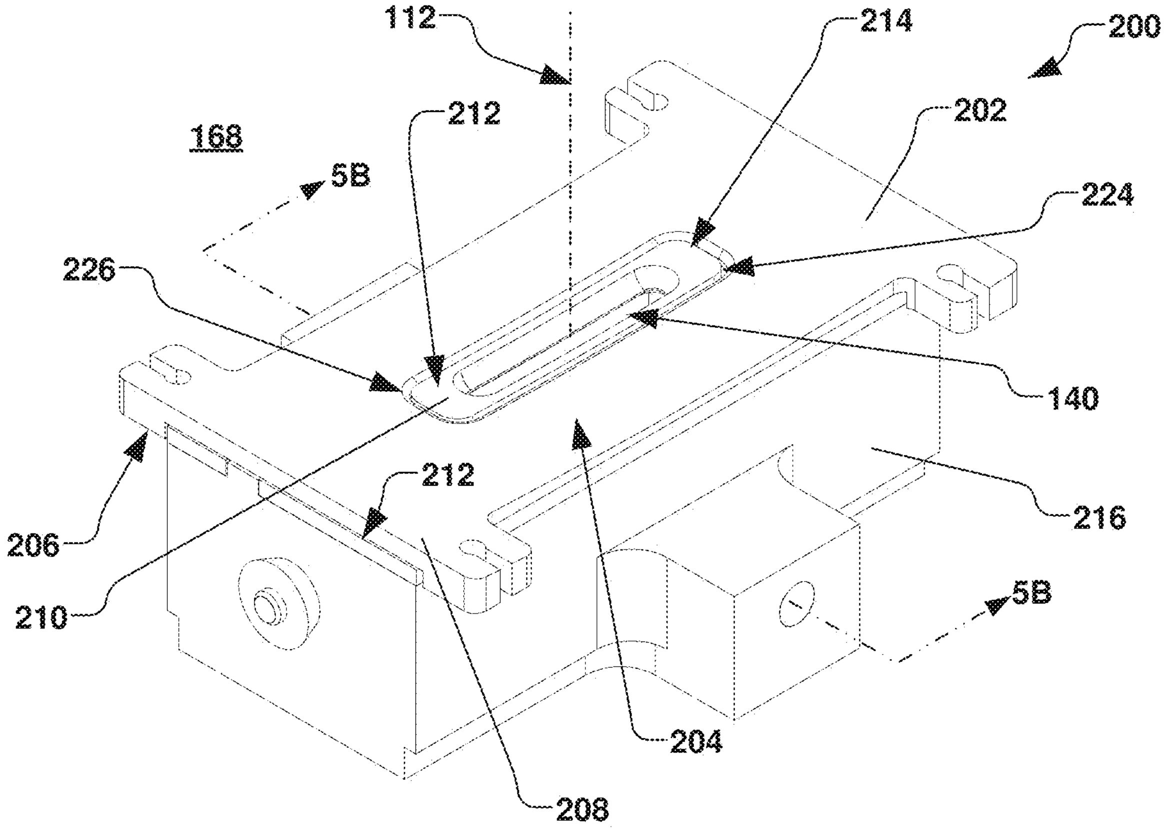
FIG. 5A illustrates a perspective view of an arc chamber according to various aspects of the present disclosure.
Figure 5B:
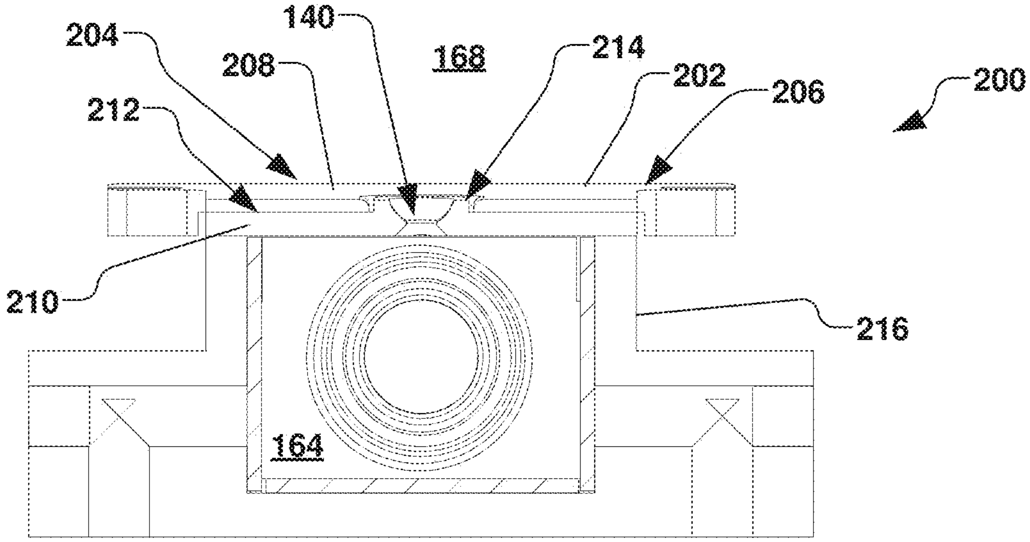
FIG. 5B illustrates a cross-sectional view of the arc chamber of FIG. 5A, according to various aspects of the present disclosure.

In order to reduce such a radiation heat loss on the front plate 138 of the ion source assembly 108, as illustrated in the examples shown in FIGS. 4 and 5A-5B, the present disclosure provides an arc chamber 200 having one or more radiation shields 202 (also called a heat shield), whereby the one or more radiation shields generally define a radiative barrier 204 between the arc chamber environment 164 of the arc chamber 200 and the external environment 168. The present disclosure contemplates the arc chamber 134 of FIG. 1, for example, as being configured to comprise one or more features of the arc chamber 200 of FIGS. 4 and 5A-5B, as will be discussed hereafter.

The present disclosure advantageously provides an extraction electrode apparatus 206 (e.g., a front aperture plate assembly) comprising a clamping plate 208 and the one or more radiation shields 202. The clamping plate 208, for example, is associated with an extraction aperture plate 210, whereby the clamping plate extends toward the front aperture 140, and whereby almost the entire extraction aperture plate is covered by the clamping plate on an outwardly-facing side 212 of the extraction aperture plate on the arc chamber 200, except for a region 214 proximate to the front aperture 140. As such, the clamping plate 208 advantageously acts as a radiation heat shield over the majority of extraction aperture plate 210 of the extraction electrode apparatus 206, thereby reducing the heat loss from the extraction aperture plate and maintaining a substantially higher temperature thereof, as compared to that heretofore seen. Such a higher temperature, for example, is believed to decrease the amount of phosphorus stored in the extraction aperture plate 210.

Figure 6A:
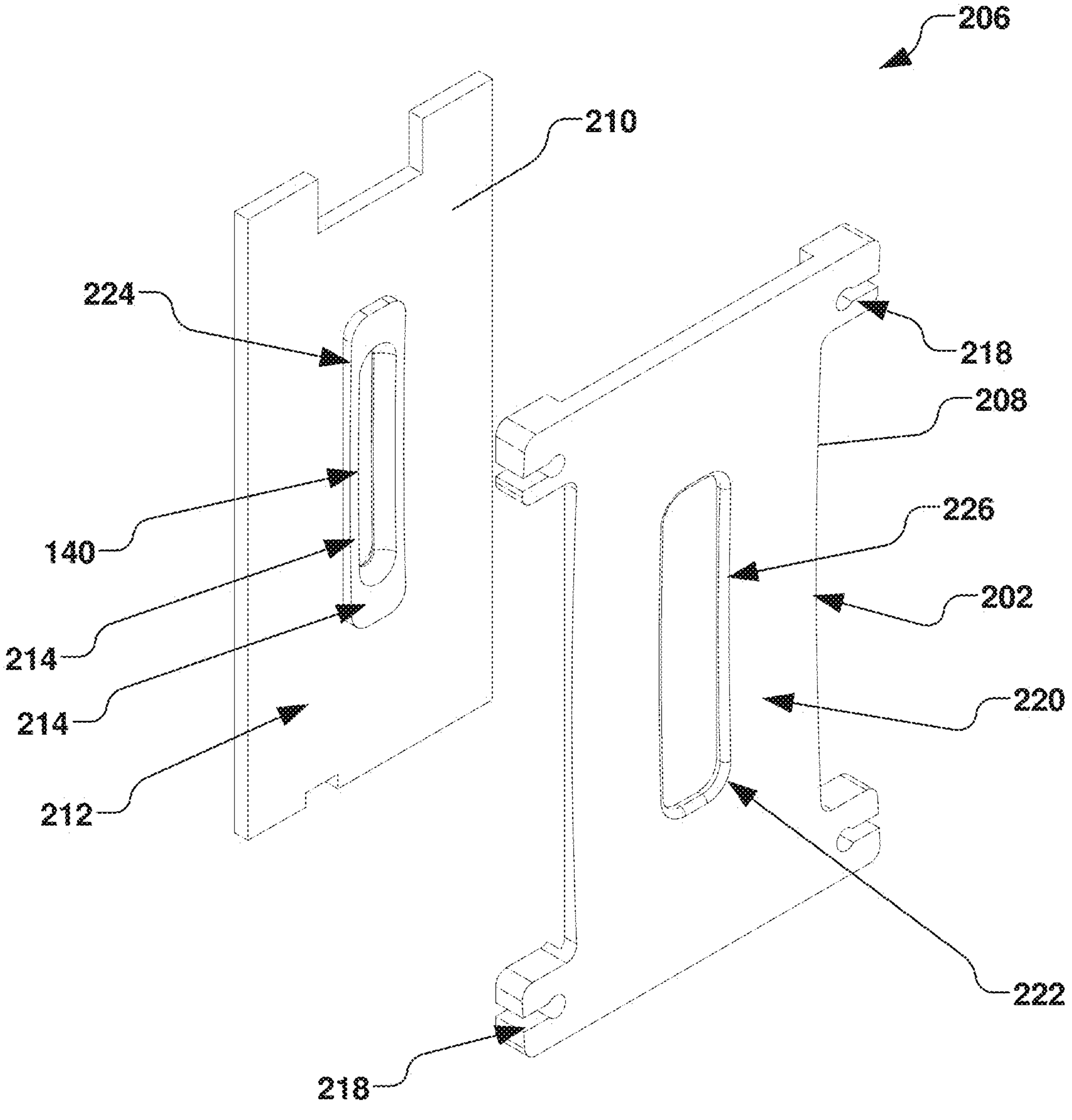
FIG. 6A illustrates an exploded perspective view of an extraction electrode apparatus according to various aspects of the present disclosure.
Figure 6B:
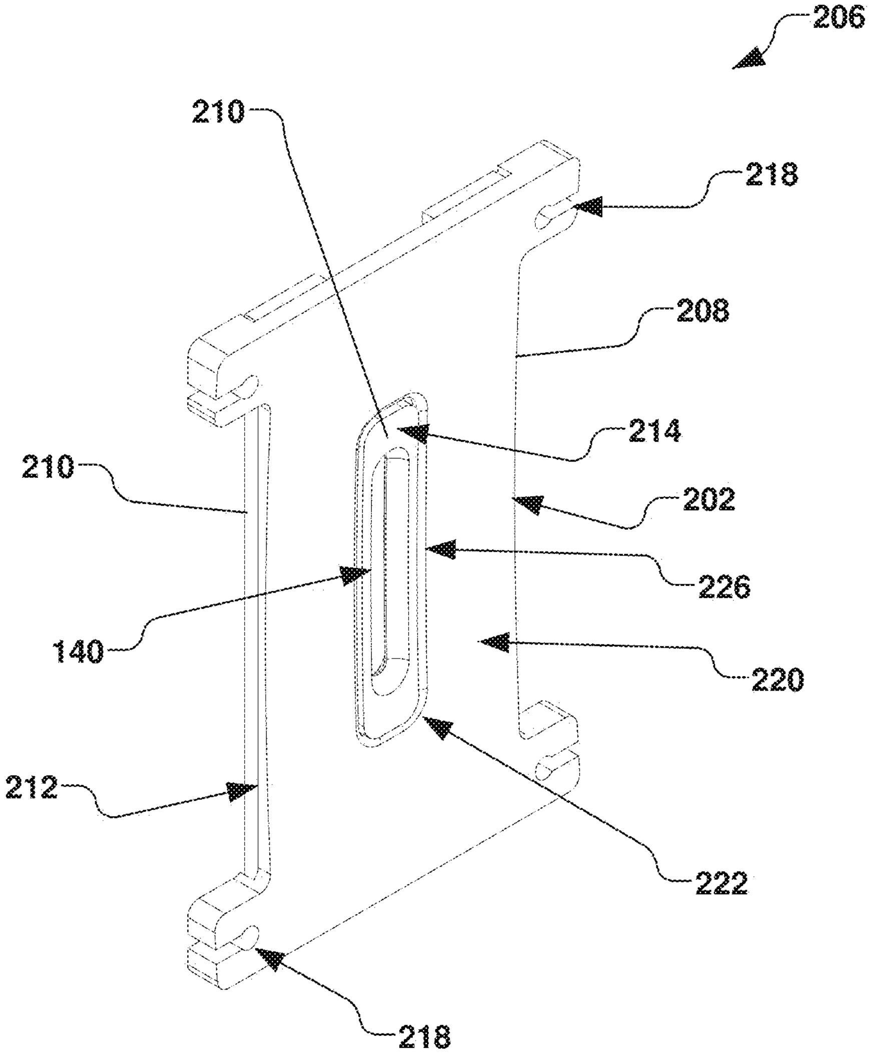
FIG. 6B illustrates a perspective view of the extraction electrode apparatus of FIG. 6A, as assembled, according to various aspects of the present disclosure.

FIGS. 6A-6B illustrate the extraction electrode apparatus 206 in one example, whereby the extraction aperture plate 210 comprises the front aperture 140 for extraction of the ion beam of FIG. 1, therethrough. The extraction aperture plate 210 of FIGS. 6A-6B, for example, is clamped or otherwise secured to the arc chamber body 216 of the arc chamber 200 of FIG. 4 via one or more fasteners (not shown) passing through openings 218 of the clamping plate 208 of FIGS. 6A-6B. Further, in order to maintain a desired shape of an electrostatic field associated with the ion beam 112 of FIG. 1, the present disclosure further provides a front face 220 of the clamping plate 208 of FIGS. 6A-6B having a radius 222 that can be similar to the front surface of a conventional extraction plate. The extraction aperture plate 210, for example, may further comprise a raised portion 224 mating with a clamping plate aperture 226, whereby the outwardly-facing side 212 of the extraction aperture plate is only exposed to the external environment 168 through the clamping plate aperture 226, as illustrated in FIG. 5A.

Accordingly, the extraction aperture plate 210 of the present disclosure is maintained at a higher temperature due to the radiative barrier 204 attained by the clamping plate 208 as the one or more radiation shields 202 are positioned between the arc chamber environment 164 of the arc chamber 200 and the external environment 168, as illustrated in FIG. 5B. As such, by maintaining the higher temperature of the extraction aperture plate 210, deleterious outgassing can be mitigated. Likewise, the one or more radiation shields 202 associated with the arc chamber body 216 of the arc chamber 200 may further maintain the higher temperature within the arc chamber, thus further mitigating outgassing.

As such, by keeping the temperature associated with the arc chamber 200 substantially high during lower-temperature implantations associated with a first species such as phosphorous, a diffusion of phosphorous or formation of alloys in the components is limited when using a material such as tungsten for the extraction aperture plate 210. As such, subsequent higher-temperature implantations associated with a second species such as arsenic 4+ or boron will experience lower outgassing of the first species due to the limited diffusion or alloy formation. Likewise, in circumstances where the extraction aperture plate 210 is comprised of graphite, diffusion of the first species into the graphite is limited by maintaining the higher temperatures within the arc chamber 200, whereby maintaining the higher temperatures of the components generally limits or prevents the first species from outgassing when operating the second species.

Accordingly, the present disclosure advantageously extends a lifetime of the ion source assembly 108 and associated electrodes and components of FIG. 1, thereby producing a more stable ion beam 112 across multiple species and energies, and allowing substantially higher beam currents than previously seen. The present disclosure, for example, may be utilized to electrically dope a workpiece comprised of silicon carbide, silicon, or other material (s) at temperatures from room temperature to 1000° C., with improved source lifetimes, beam currents, and operational characteristics over conventional techniques.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An arc chamber for an ion source, the arc chamber comprising:

a source of thermal radiation positioned within an interior region of the arc chamber;

one or more components generally enclosing the interior region of the arc chamber, therein defining an arc chamber environment within the interior region of the arc chamber, wherein a first of the one or more components comprises an extraction aperture plate having an extraction aperture defined therethrough; and one or more thermal radiation shields positioned between the one or more components and an external environment directly outside of the arc chamber, whereby the one or more thermal radiation shields limit a transfer of the thermal radiation from the arc chamber environment to the external environment, wherein the one or more thermal radiation shields and the extraction aperture plate are comprised of the same material.

2. The arc chamber of claim 1, wherein the extraction aperture is defined along an exterior surface of the extraction aperture plate, wherein the first of the one or more thermal radiation shields is positioned proximate to, and covers at least approximately 75% of the exterior surface of, the extraction aperture plate.

3. The arc chamber of claim 2, wherein the first of the one or more thermal radiation shields covers substantially all of the exterior surface of the extraction aperture plate.

4. The arc chamber of claim 2, the first of the one or more thermal radiation shields generally prevents thermal radiation for passing through the extraction aperture plate, except for a transfer of the thermal radiation through the extraction aperture.

5. The arc chamber of claim 2, wherein the extraction aperture plate comprises a raised portion, and wherein the first of the one or more thermal radiation shields comprises an opening defined therethrough, wherein the raised portion of the extraction aperture plate is configured to extend through the opening in the first of the one or more thermal radiation shields.

6. The arc chamber of claim 1, further comprising one or more coupling features configured for selectively coupling of at least the first of the one or more thermal radiation shields to a body of the arc chamber.

7. The arc chamber of claim 1, wherein the one or more thermal radiation shields comprise one or more layers of a material configured to provide a radiative barrier between the arc chamber environment and the external environment.

8. An extraction aperture assembly for an arc chamber of an ion source, comprising:

an extraction aperture plate having an extraction aperture defined therethrough, wherein the extraction aperture is defined along an exterior surface of the extraction aperture plate; and a thermal radiation shield configured to selectively couple the extraction aperture plate to the arc chamber, wherein the thermal radiation shield is configured to cover at least approximately 75% of the exterior surface of the extraction aperture plate, thereby limiting a transfer of thermal radiation from arc chamber environment to an external environment, wherein the thermal radiation shield comprises one or more coupling features configured for selectively coupling at least the thermal radiation shield to a body of the arc chamber, and wherein the thermal radiation shield and the extraction aperture plate are comprised of the same material.

9. The extraction aperture assembly of claim 8, wherein the thermal radiation shield generally prevents thermal radiation for passing through the extraction aperture plate, except for a transfer of the thermal radiation through the extraction aperture.

10. The extraction aperture assembly of claim 8, wherein the thermal radiation shield covers substantially all of the exterior surface of the extraction aperture plate, except for a region proximate to the extraction aperture.

11. The extraction aperture assembly of claim 8, wherein the extraction aperture plate comprises a raised portion extending from the exterior surface, and wherein the thermal radiation shield comprises an opening defined therethrough, wherein the raised portion of the extraction aperture plate is configured to extend through the opening in the thermal radiation shield.

12. An extraction aperture assembly for an arc chamber of an ion source, comprising:

an extraction aperture plate having an extraction aperture defined therethrough, wherein the extraction aperture is defined along an exterior surface of the extraction aperture plate, and wherein the extraction aperture plate comprises a raised portion extending from the exterior surface; and a thermal radiation shield configured to selectively couple the extraction aperture plate to the arc chamber, wherein the thermal radiation shield comprises an opening defined therethrough, wherein the raised portion of the extraction aperture plate is configured to extend through the opening in the thermal radiation shield, and wherein the thermal radiation shield is configured to cover at least approximately 75% of the exterior surface of the extraction aperture plate, thereby limiting a transfer of thermal radiation from the extraction aperture plate, and wherein the thermal radiation shield and the extraction aperture plate are comprised of the same material.

13. The extraction aperture assembly of claim 12, wherein the thermal radiation shield generally prevents thermal radiation for passing through the extraction aperture plate, except for a transfer of the thermal radiation through a region proximate to the extraction aperture.

14. The extraction aperture assembly of claim 12, wherein the thermal radiation shield covers substantially all of the exterior surface of the extraction aperture plate, except for a region proximate to the extraction aperture.

15. The extraction aperture assembly of claim 12, wherein the thermal radiation shield comprises one or more layers of a material configured as radiative barrier.

16. The extraction aperture assembly of claim 12, further comprising one or more coupling features configured for selectively coupling the thermal radiation shield to a body of the arc chamber.

* * * * *